(12) United States Patent
Aruppukottai Boominathan et al.

(10) Patent No.: US 10,141,894 B1
(45) Date of Patent: Nov. 27, 2018

(54) RADIO FREQUENCY (RF) AMPLIFIER

(71) Applicant: QUALCOMM INCORPORATED, San Diego, CA (US)

(72) Inventors: Karthikeya Aruppukottai Boominathan, San Diego, CA (US); Krishnaswamy Thiagarajan, Bangalore (IN); Mahim Ranjan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/640,659

(22) Filed: Jul. 3, 2017

(51) Int. Cl.
| | | |
|---|---|---|
| *H03F 1/22* | (2006.01) | |
| *H03F 1/32* | (2006.01) | |
| *H03F 3/195* | (2006.01) | |

(52) U.S. Cl.
CPC ............ *H03F 1/3205* (2013.01); *H03F 1/223* (2013.01); *H03F 3/195* (2013.01); *H03F 2200/294* (2013.01); *H03F 2200/451* (2013.01)

(58) Field of Classification Search
CPC ............. H03F 1/22; H03F 1/223; H03F 1/226
USPC .......................................................... 330/311
See application file for complete search history.

(56) References Cited

U.S. PATENT DOCUMENTS

| | | | |
|---|---|---|---|
| 5,032,799 A | 7/1991 | Milberger et al. | |
| 6,107,885 A | 8/2000 | Miguelez et al. | |
| 7,853,235 B2 | 12/2010 | Aparin | |
| 7,936,220 B2 * | 5/2011 | Li | H03F 1/223 330/149 |
| 8,626,106 B2 * | 1/2014 | Soe | H03D 7/125 330/311 |

FOREIGN PATENT DOCUMENTS

| | | | |
|---|---|---|---|
| JP | 2014217252 A | * | 11/2014 |
| WO | 2016133896 A1 | | 8/2016 |

OTHER PUBLICATIONS

Aparin V., et al., "Modified Derivative Superposition Method for Linearizing FET Low-Noise Amplifiers", IEEE Transactions on Microwave Theory and Techniques, IEEE Service Center, Piscataway, NJ, US, Feb. 1, 2005 (Feb. 1, 2005), vol. 53, No. 2, pp. 571-581, XP011126918.

Webster D.R., et al., "Derivative Superposition—A Linearisation Technique for Ultra Broadband Systems", IEEE Wideband Circuits, Modeling, Technology Colloq., May 1996, pp. 3/1-3/14.

Zhang J., et al., "Linearity Improvement Using a Modified Derivative Superposition Method in Cascaded Stages Amplifier," IEEE, IET Microwaves, Antennas and Propagation, vol. 6, No. 8, 2012, pp. 922-928.

\* cited by examiner

*Primary Examiner* — Steven J Mottola
(74) *Attorney, Agent, or Firm* — Smith Tempel Blaha LLC/Qualcomm

(57) ABSTRACT

A circuit includes a first amplifier path comprising a first amplifier, $M_A$, a second amplifier path comprising a cascode device and a second amplifier, $M_B$, a node defined by a source of the cascode device and a drain of the second amplifier, $M_B$, and a capacitance coupled between the node and a source of the second amplifier, $M_B$.

30 Claims, 11 Drawing Sheets

RADIO FREQUENCY (RF) AMPLIFIER

FIELD

The present disclosure relates generally to electronics, and more specifically to transmitters and receivers and amplifiers implemented therein.

BACKGROUND

In a radio frequency (RF) transceiver, a communication signal is typically amplified and transmitted by a transmit section. A transmit section may comprise one or more circuits that amplify and transmit the communication signal. The amplifier circuit or circuits may comprise one or more amplifier stages that may include one or more driver stages and one or more power amplifier stages. Each of the amplifier stages typically comprises one or more transistors configured in various ways to amplify the communication signal.

One of the challenges in designing a power amplifier in an RF transmitter is managing intermodulation distortion (IM or IMD). Intermodulation can be described as the amplitude modulation of a signal containing two or more frequencies caused by nonlinearities in a system. The intermodulation between each frequency component will form additional signals at frequencies that are not just at harmonic frequencies (integer multiples) of either signal, but also at the sum and difference frequencies of the original frequencies and at multiples of those sum and difference frequencies. One intermodulation component that may be particularly destructive is the third order intermodulation product, also referred to as IM3 that gives rise to two-tone third order intermodulation distortion, IMD3. Two-tone IMD3 is the measure of the third-order distortion products produced by a nonlinear device when two tones closely spaced in frequency are provided into its input. This distortion product is usually located sufficiently close to the carrier frequency so as to be difficult to filter out and can cause interference in multichannel communications equipment.

It is desirable to implement improved RF amplifiers and/or to reduce or eliminate IM3 and IMD3 in such amplifiers.

SUMMARY

Various implementations of systems, methods and devices within the scope of the appended claims each have several aspects, no single one of which is solely responsible for the desirable attributes described herein. Without limiting the scope of the appended claims, some prominent features are described herein.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

One aspect of the disclosure provides a circuit including a first amplifier path comprising a first amplifier, $M_A$, a second amplifier path comprising a cascode device and a second amplifier, $M_B$, a node defined by a source of the cascode device and a drain of the second amplifier, $M_B$, and a capacitance coupled between the node and a source of the second amplifier, $M_B$.

Another aspect of the disclosure provides a circuit, including means for providing adjustable capacitance at a cascode node of an amplifier, and means for adjusting the capacitance to minimize third order intermodulation distortion (IMD3) in the amplifier.

Another aspect of the disclosure provides a method for minimizing distortion in an amplifier including providing a capacitance at a cascode node of an amplifier, and adjusting the capacitance to minimize third order intermodulation distortion (IMD3) in the amplifier.

Another aspect of the disclosure provides a method for an amplifier. The method includes amplifying a signal in a first amplifier path carrying a first current, $I_A$, amplifying the signal in a second amplifier path carrying a second current, $I_B$, and adjusting a capacitance at a cascode node of the second amplifier path to reduce third order intermodulation distortion (IMD3) in the amplifier.

Another aspect of the disclosure provides an amplifier including a first amplifier path comprising a first cascode device and a first amplifier, $M_A$, the first amplifier path configured to carry a first current, $I_A$, a second amplifier path comprising a second cascode device and a second amplifier, $M_B$, the second amplifier path configured to carry a second current, $I_B$, a node defined by a source of the second cascode device and a drain of the second amplifier, $M_B$, and a capacitor coupled between the node and a source of the second amplifier, $M_B$, the capacitor configured to create a phase displacement between the second current, $I_B$, and the first current, $I_A$.

Another aspect of the disclosure provides an amplifier including a first amplifier path comprising a first cascode device and a first amplifier, $M_A$, the first amplifier path configured to carry a first current, $I_A$, a second amplifier path comprising a second cascode device and a second amplifier, $M_B$, the second amplifier path configured to carry a second current, $I_B$, and a capacitor coupled between a source of the second amplifier, $M_B$, and a node disposed between a source of the second cascode device and a drain of the second amplifier, $M_B$, the capacitor configured to create a phase displacement between the second current, $I_B$, and the first current, $I_A$.

Another aspect of the disclosure provides an apparatus including a first amplification transistor coupled to an input signal and an output, a second amplification transistor coupled to the input signal and the output, and an adjustable capacitor coupled across the second amplification transistor. For example, the adjustable capacitor may be coupled between a source of the second amplification transistor and a drain of the second amplification transistor. The apparatus may further comprise a first cascode transistor coupled between the first amplification transistor and the output, and/or a second cascode transistor coupled between the second amplification transistor and the output.

BRIEF DESCRIPTION OF THE DRAWINGS

In the figures, like reference numerals refer to like parts throughout the various views unless otherwise indicated. For reference numerals with letter character designations such as "102a" or "102b", the letter character designations may differentiate two like parts or elements present in the same figure. Letter character designations for reference numerals may be omitted when it is intended that a reference numeral encompass all parts having the same reference numeral in all figures.

DETAILED DESCRIPTION

The word "exemplary" is used herein to mean "serving as an example, instance, or illustration." Any aspect described herein as "exemplary" is not necessarily to be construed as preferred or advantageous over other aspects.

Certain exemplary embodiments described herein may include a derivative superposition architecture for linearizing a radio frequency power amplifier and elements thereof, for example a RF power amplifier in a transmitter, and elements thereof. Other implementations and advantages are described below.

Figure 1:
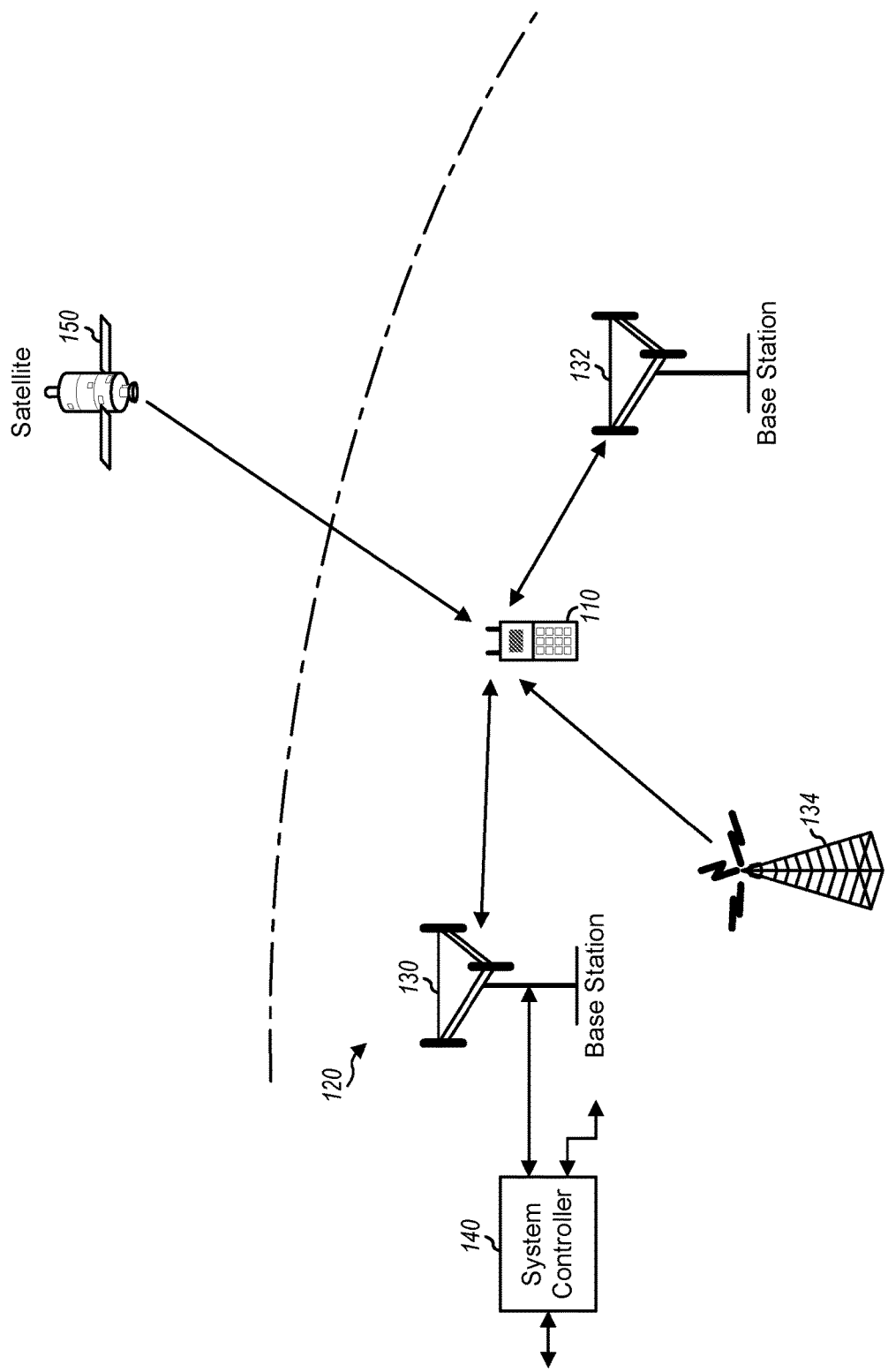
FIG. 1 is a diagram showing a wireless device communicating with a wireless communication system.

FIG. 1 is a diagram showing a wireless device 110 communicating with a wireless communication system 120. The wireless communication system 120 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1x, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless communication system may include any number of base stations and any set of network entities.

The wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a tablet, a cordless phone, a wireless local loop (WLL) station, a Bluetooth device, etc. Wireless device 110 may communicate with wireless communication system 120. Wireless device 110 may also receive signals from and transmit signals to broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, WCDMA, CDMA 1x, EVDO, TD-SCDMA, GSM, 802.11, etc.

Wireless device 110 may support carrier aggregation, which may include operation on multiple carriers. Carrier aggregation may also be referred to as multi-carrier operation. Wireless device 110 may be able to operate in low-band (LB) covering frequencies lower than 1000 megahertz (MHz), mid-band (MB) covering frequencies from 1000 MHz to 2300 MHz, and/or high-band (HB) covering frequencies higher than 2300 MHz. For example, low-band may cover 698 to 960 MHz, mid-band may cover 1475 to 2170 MHz, and high-band may cover 2300 to 2690 MHz and 3400 to 3800 MHz. Low-band, mid-band, and high-band refer to three groups of bands (or band groups), with each band group including a number of frequency bands (or simply, "bands"). Each band may cover up to 200 MHz and may include one or more carriers. Each carrier may cover up to 20 MHz in LTE. LTE Release 11 supports 35 bands, which are referred to as LTE/UMTS bands and are listed in 3GPP TS 36.101. Wireless device 110 may be configured with up to five carriers in one or two bands in LTE Release 11. In some embodiments, wireless device 100 may be configured to operate at millimeter wave frequencies, for example around 38 GHz, 60 GHz, etc. and/or at other GHz frequencies such as 6 GHz or 28 GHz.

In general, carrier aggregation (CA) may be categorized into two types—intra-band CA and inter-band CA. Intra-band CA refers to operation on multiple carriers within the same band. Inter-band CA refers to operation on multiple carriers in different bands.

Figure 2:
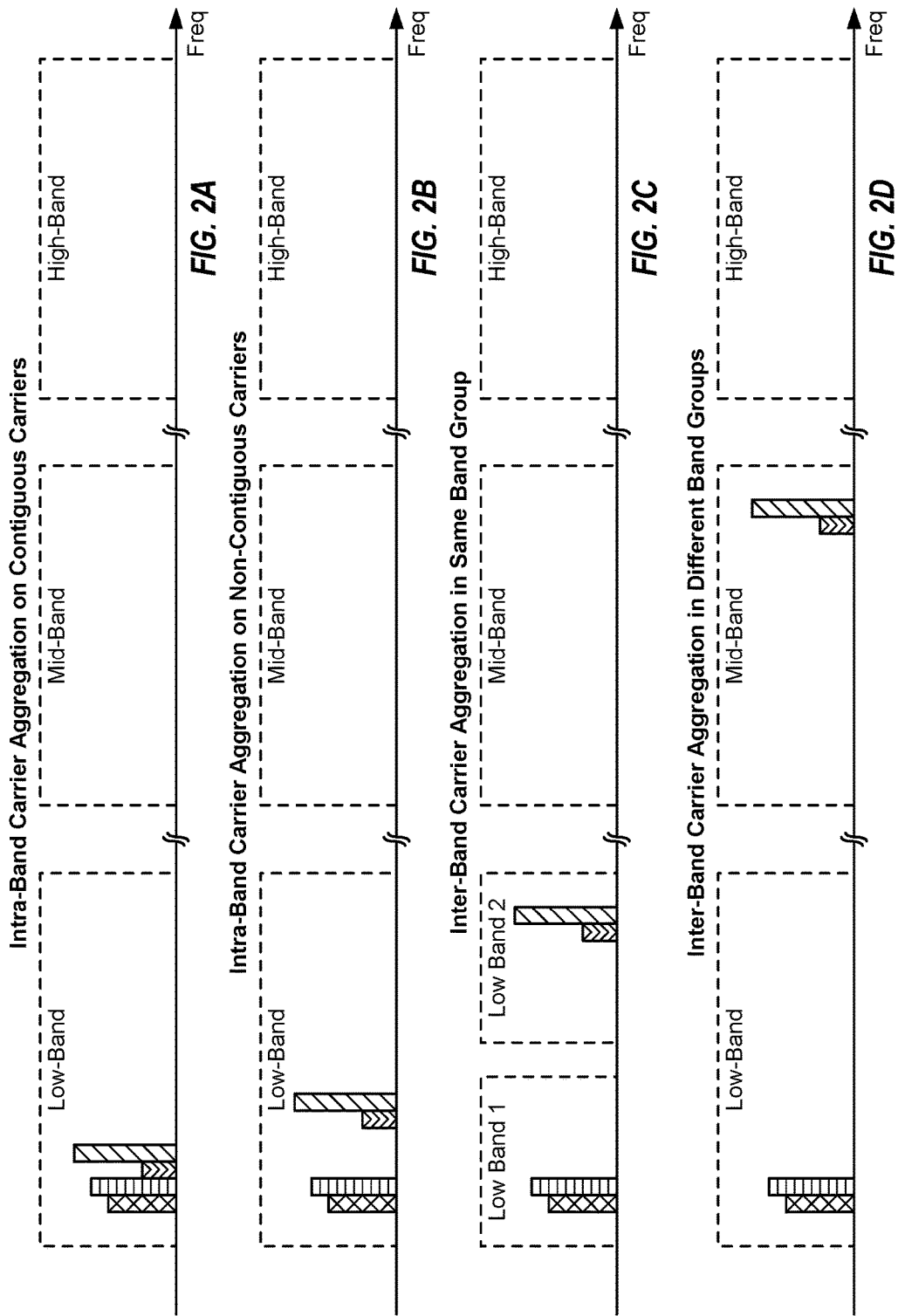
FIG. 2A is a graphical diagram showing an example of contiguous intra-band carrier-aggregation (CA).
FIG. 2B is a graphical diagram showing an example of non-contiguous intra-band CA.
FIG. 2C is a graphical diagram showing an example of inter-band CA in the same band group.
FIG. 2D is a graphical diagram showing an example of inter-band CA in different band groups.

FIG. 2A is a graphical diagram showing an example of contiguous intra-band carrier-aggregation (CA). In the example shown in FIG. 2A, wireless device 110 is configured with four contiguous carriers in one band in low-band. Wireless device 110 may send and/or receive transmissions on the four contiguous carriers within the same band.

FIG. 2B is a graphical diagram showing an example of non-contiguous intra-band CA. In the example shown in FIG. 2B, wireless device 110 is configured with four non-contiguous carriers in one band in low-band. The carriers may be separated by 5 MHz, 10 MHz, or some other amount. Wireless device 110 may send and/or receive transmissions on the four non-contiguous carriers within the same band.

FIG. 2C is a graphical diagram showing an example of inter-band CA in the same band group. In the example shown in FIG. 2C, wireless device 110 is configured with four carriers in two bands in low-band. Wireless device 110 may send and/or receive transmissions on the four carriers in different bands in the same band group.

FIG. 2D is a graphical diagram showing an example of inter-band CA in different band groups. In the example shown in FIG. 2D, wireless device 110 is configured with four carriers in two bands in different band groups, which include two carriers in one band in low-band and two carriers in another band in mid-band. Wireless device 110 may send and/or receive transmissions on the four carriers in different bands in different band groups.

FIGS. 2A to 2D show four examples of carrier aggregation. Carrier aggregation may also be supported for other combinations of bands and band groups.

Figure 3:
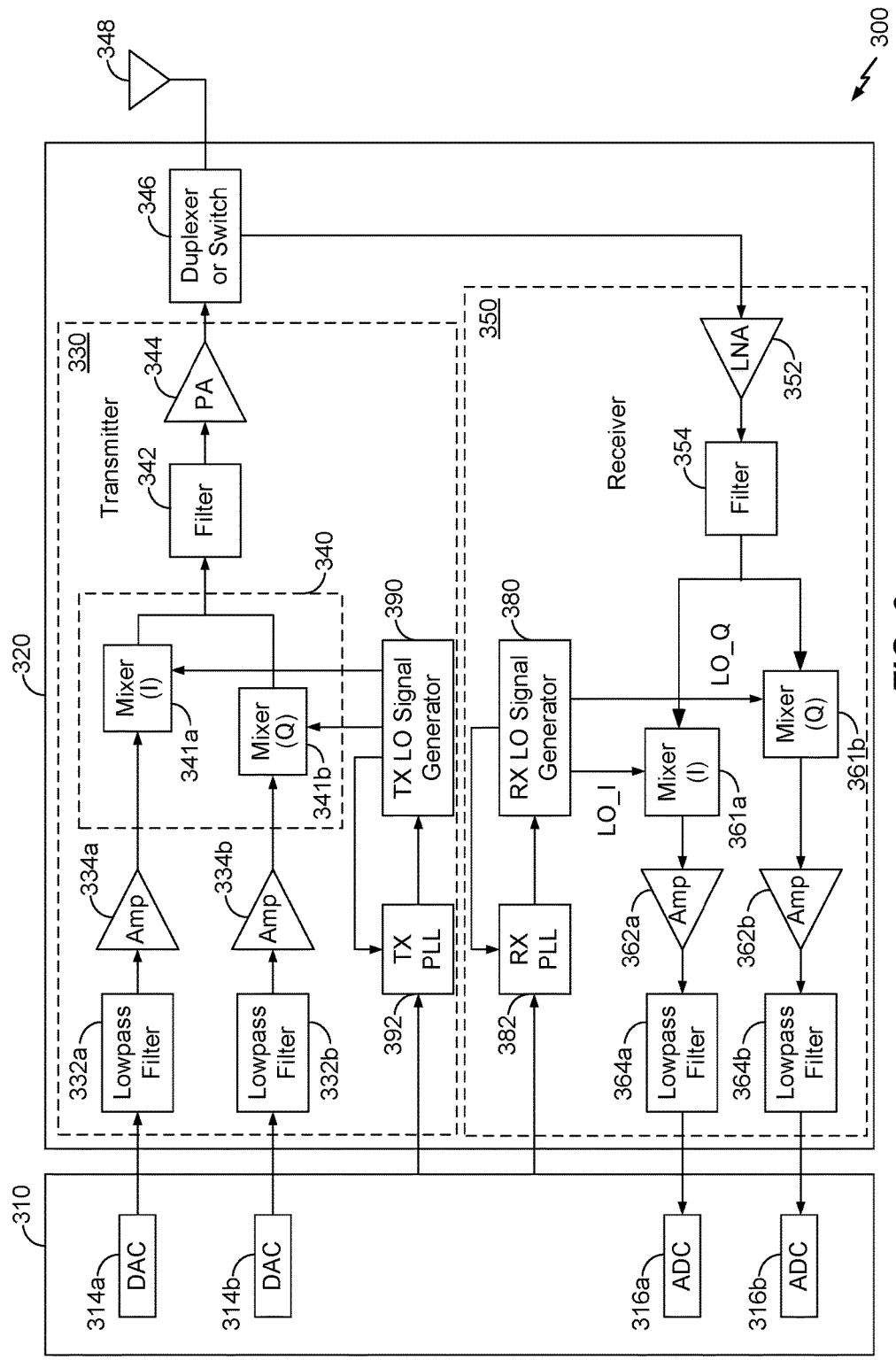
FIG. 3 is a block diagram showing a wireless device in which the exemplary techniques of the present disclosure may be implemented.

FIG. 3 is a block diagram showing a wireless device 300 in which exemplary techniques of the present disclosure may be implemented. FIG. 3 shows an example of a transceiver 320. In general, the conditioning of the signals in a transmitter 330 and a receiver 350 may be performed by one or more stages of amplifier, filter, upconverter, downconverter, etc. These circuit blocks may be arranged differently from the configuration shown in FIG. 3. Furthermore, other circuit blocks not shown in FIG. 3 may also be used to condition the signals in the transmitter 330 and receiver 350. Unless otherwise noted, any signal in FIG. 3, or any other figure in the drawings, may be either single-ended or differential. Some circuit blocks in FIG. 3 may also be omitted.

In the example shown in FIG. 3, wireless device 300 generally comprises a transceiver 320 and a data processor 310. The data processor 310 may include a memory (not shown) to store data and program codes, and may generally comprise analog and digital processing elements. The transceiver 320 includes a transmitter 330 and a receiver 350 that support bi-directional communication. In general, wireless device 300 may include any number of transmitters and/or receivers for any number of communication systems and frequency bands. All or a portion of the transceiver 320 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency-converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the example shown in FIG. 3, transmitter 330 and receiver 350 are implemented with the direct-conversion architecture.

In the transmit path, the data processor 310 processes data to be transmitted and provides in-phase (I) and quadrature (Q) analog output signals to the transmitter 330. In an exemplary embodiment, the data processor 310 includes digital-to-analog-converters (DAC's) 314a and 314b for converting digital signals generated by the data processor 310 into the I and Q analog output signals, e.g., I and Q output currents, for further processing. In other embodiments, the DAC's 314a and 314b are included in the transceiver 320 and the data processor 310 provides data (e.g., for I and Q) to the transceiver 320 digitally.

Within the transmitter 330, lowpass filters 332a and 332b filter the I and Q analog transmit signals, respectively, to remove undesired images caused by the prior digital-to-analog conversion. Amplifiers (Amp) 334a and 334b amplify the signals from lowpass filters 332a and 332b, respectively, and provide I and Q baseband signals. An upconverter 340 upconverts the I and Q baseband signals with I and Q transmit (TX) local oscillator (LO) signals from a TX LO signal generator 390 and provides an upconverted signal. A filter 342 filters the upconverted signal to remove undesired images caused by the frequency upconversion as well as noise in a receive frequency band. A power amplifier (PA) 344 amplifies the signal from filter 342 to obtain the desired output power level and provides a transmit RF signal. The transmit RF signal is routed through a duplexer or switch 346 and transmitted via an antenna 348.

In the receive path, antenna 348 receives communication signals and provides a received RF signal, which is routed through duplexer or switch 346 and provided to a low noise amplifier (LNA) 352. The duplexer 346 is designed to operate with a specific RX-to-TX duplexer frequency separation, such that RX signals are isolated from TX signals. The received RF signal is amplified by LNA 352 and filtered by a filter 354 to obtain a desired RF input signal. Downconversion mixers 361a and 361b mix the output of filter 354 with I and Q receive (RX) LO signals (i.e., LO_I and LO_Q) from an RX LO signal generator 380 to generate I and Q baseband signals. The I and Q baseband signals are amplified by amplifiers 362a and 362b and further filtered by lowpass filters 364a and 364b to obtain I and Q analog input signals, which are provided to data processor 310. In the exemplary embodiment shown, the data processor 310 includes analog-to-digital-converters (ADC's) 316a and 316b for converting the analog input signals into digital signals to be further processed by the data processor 310. In some embodiments, the ADC's 316a and 316b are included in the transceiver 320 and provide data to the data processor 310 digitally.

In FIG. 3, TX LO signal generator 390 generates the I and Q TX LO signals used for frequency upconversion, while RX LO signal generator 380 generates the I and Q RX LO signals used for frequency downconversion. Each LO signal is a periodic signal with a particular fundamental frequency. A phase locked loop (PLL) 392 receives timing information from data processor 310 and generates a control signal used to adjust the frequency and/or phase of the TX LO signals from LO signal generator 390. Similarly, a PLL 382 receives timing information from data processor 310 and generates a control signal used to adjust the frequency and/or phase of the RX LO signals from LO signal generator 380.

Wireless device 300 may support CA and may (i) receive multiple downlink signals transmitted by one or more cells on multiple downlink carriers at different frequencies and/or (ii) transmit multiple uplink signals to one or more cells on multiple uplink carriers. Those of skill in the art will understand, however, that aspects described herein may be implemented in systems, devices, and/or architectures that do not support carrier aggregation.

Certain elements of the transceiver 320 are functionally illustrated in FIG. 3, and the configuration illustrated therein may or may not be representative of a physical device configuration in certain implementations. For example, as described above, transceiver 320 may be implemented in various integrated circuits (ICs), RF ICs (RFICs), mixed-signal ICs, etc. In some embodiments, the transceiver 320 is implemented on a substrate or board such as a printed circuit board (PCB) having various modules. For example, the PA 344, the filter 342, and the duplexer 346 may be implemented in separate modules or as discrete components, while the remaining elements illustrated in the transceiver 320 may be implemented in a single transceiver chip.

The power amplifier 344 may comprise one or more stages comprising, for example, driver stages, power amplifier stages, or other components, that can be configured to amplify a communication signal on one or more frequencies, in one or more frequency bands, and at one or more power levels. Depending on various factors, the power amplifier 344 can be configured in various ways and can be configured in a derivative superposition architecture. In some embodiments, this architecture is adapted to linearize the amplifier and minimize a third order intermodulation product (IM3) and third order modulation distortion (IMD3).

In an exemplary embodiment of the present disclosure, a derivative superposition architecture may be incorporated with or into the power amplifier 344, for example to provide a linear output. In a particular exemplary embodiment, a modified derivative superposition architecture may include two transconductance (gm stage) devices, at least one of the gm stage devices also having a cascode transistor architecture. In an exemplary embodiment, a capacitance may be coupled between the drain and source of the cascoded transconductance amplifier (gm stage). In an exemplary embodiment, the capacitance coupled to the cascoded transconductance amplifier (gm stage) may be adjustable, or variable, such that a current flowing through the cascoded gm stage is displaced in phase with respect to a current flowing through the other gm stage. In some embodiments, the architecture is incorporated into a pre-driver stage of the power amplifier 344. Those of skill in the art, however, will recognize that aspects described herein may be implemented in transmit architectures which differ from the architecture illustrated in FIG. 3. Further, those of skill in the art will recognize that aspects described herein may be implemented in other amplifiers (e.g., LNA) or other portions of the PA 344 (for example the driver or output stage).

In an exemplary embodiment, one amplifier arrangement may use two common-source transconduction (gm) devices ($M_A$ and $M_B$), such as field effect transistors (FETs), biased in different regions of operation, where one FET ($M_B$) is biased in strong inversion and the other FET ($M_A$) is biased in weak inversion. In such an arrangement, the $3^{rd}$ derivate of drain current ($I_D$) with respect to gate-source voltage ($V_{gs}$), which can be represented as $g_3$, has opposite signs for each of the two common-source transconduction (gm) devices $M_A$ and $M_B$. The $3^{rd}$ order intermodulation products (IM3) generated by the transconduction devices is directly proportional to $g_3$. Hence, by appropriately sizing the widths of $M_A$ and $M_B$, the effective $g_3$ of the sum of the currents through $M_A$ and $M_B$ ($I_{SUM}$) can be made zero ($g_3=g_{3A}+g_{3B}=0$), thus reducing the third order intermodulation product (IM3) at the output of the amplifier.

However, inductance at the source of the FET $M_B$ can raise the IM3 component and the IMD3 distortion. The inductance may be from an inductive degeneration element (L) added at the source of the FET $M_B$ in a low noise amplifier implemented in a receiver, or can be parasitic inductance in any amplifier caused by circuit routing, etc.

To minimize IM3 at the output of an amplifier, a phase displacement (phase lag) may be created between the drain current ($I_B$) through $M_B$ with respect to the drain current ($I_A$) through $M_A$. One way of introducing such a phase displacement is to create different inductances at the respective sources of the FET $M_A$ and the FET $M_B$, where the inductance at the source of the FET $M_B$ is greater than the inductance at the source of the FET $M_A$. Unfortunately, when implementing this solution in a transmitter pre-driver, a driver, or a power amplifier, it may be difficult to determine and/or apply a definitive value of inductance because at least some of the inductance is parasitic. Moreover, because the phase displacement caused by the different inductances varies across frequency and gain, it may be beneficial to implement a programmable value, which may be difficult to implement in a power amplifier stage, for example by using multiple inductances or an inductance with multiple taps. Moreover, because the FET $M_A$ and the FET $M_B$ experience different gate-source voltages ($V_{Gs}$), the IM3 cancellation may not be complete with such solutions.

Figure 4:
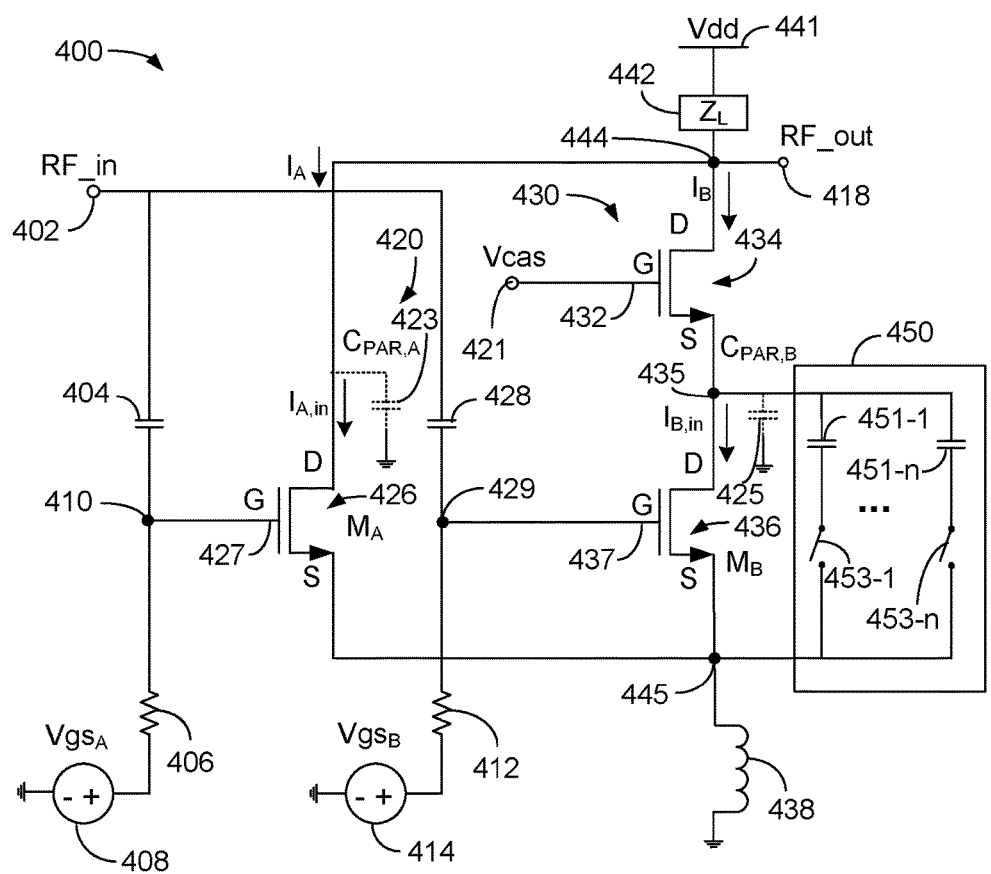
FIG. 4 is a schematic diagram illustrating an exemplary embodiment of an amplifier system.

FIG. 4 is a schematic diagram illustrating an exemplary embodiment of an amplifier system 400. The amplifier system 400 comprises a first current path 420 and a second current path 430. The first current path 420 comprises a first FET 426, $M_A$, which is biased in weak to moderate inversion ($V_{Gs}$<threshold voltage, ($V_{th}$)). The first FET 426, $M_A$, may be configured as a transconductance amplifier having a gain, and can also be referred to as a first "gm" stage. A gate 427 of the first FET 426, $M_A$, may be coupled to a node 410 that may be configured to receive a first bias voltage, $Vgs_A$ from a voltage source 408 through a resistor 406.

The second current path 430 comprises a cascode FET 434, and a second FET 436, $M_B$, which is biased in strong inversion ($V_{GS}$>$V_t$h). The second FET 436, $M_B$, may be configured as a transconductance amplifier having a gain, and can also be referred to as a second "gm" stage. A gate 437 of the second FET 436, $M_B$, may be coupled to a node 429 that may be configured to receive a second bias voltage, $Vgs_B$ from a voltage source 414 through a resistor 412.

A radio frequency (RF) input signal, RF_in, may be provided to a node 402, and may be provided to the gate 427 of the first FET 426, $M_A$, through a capacitor 404, and to the gate 437 of the second FET 436, $M_B$, through a capacitor 428. In an exemplary embodiment, the capacitor 404 and the capacitor 428 may be configured as DC blocking capacitors.

In an exemplary embodiment, the drain of the cascode FET 434 is coupled to a node 444. A characteristic load impedance, $Z_L$, 442 is coupled to the node 444 and receives a system voltage Vdd, over connection 441. The gate 432 of the cascode FET 434 is coupled to a bias voltage, Vcas, at a node 421. The drain of the first FET 426, $M_A$, is also coupled to the node 444. A radio frequency (RF) output, RF_out, is taken from a node 418.

The drain of the second FET 436, $M_B$, is coupled to the source of the cascode FET 434. The source of the second FET 436, $M_B$, and the source of the first FET 426, $M_A$, are coupled to a node 445. An inductor 438 is also coupled to the node 445 and to ground, and may be configured as a source degeneration inductor. In some embodiments the inductor 438 is omitted or is inherently present in trace routing and thus is not implemented as a separate component.

A node 435 is created between the drain of the second FET 436, $M_B$, and the source of the cascode FET 434. A capacitor 450 is coupled between the node 435 and the source of the first FET 426, $M_A$, and the source of the second FET 436, $M_B$ at node 445. In other embodiments, the capacitor 450 may instead be coupled across the first FET 426, $M_A$, or there may be capacitors coupled across each of the first FET 426, $M_A$, and the second FET 436, $M_B$.

A first current, $I_A$, flows in the first current path 420, and a second current, $I_B$, flows in the second current path 430. In an exemplary embodiment shown in FIG. 4 where the first current path 420 does not comprise a cascode amplifier configuration, a current flowing through the first FET 426, $M_A$, may be referred to as $I_{A,in}$, but in this exemplary embodiment, $I_A=I_{A,in}$. In the embodiment shown in FIG. 4, the second current path 430 does comprise a cascode amplifier configuration, so a current, $I_{B,in}$ flows through the second FET 436, $M_B$. In the embodiment shown in FIG. 4, the two currents $I_B$ and $I_{B,in}$ are not the same because a small amount of the current $I_{B,in}$ would flow through the capacitor 425 at the cascode node 435.

In an exemplary embodiment, the capacitor 450 may be a variable, an adjustable or a programmable capacitor, or capacitance bank comprising a plurality of capacitors or capacitances 451-1 through 451-n, where "n" may be any integer. The capacitances 451-1 through 451-n may be switched using respective switches 453-1 through 453-n. The switches 453-1 through 453-n may be controlled by a control signal from, for example, the data processor 310 (FIG. 3) or a processor local to the transceiver 320 or within a module implemented the PA 344. In an exemplary embodiment, the capacitor 450 may be operable over a range of frequencies and a range of gain states of the first FET 426, $M_A$, and the second FET 436, $M_B$. In an exemplary embodiment, the capacitor 450 may be operable over frequency range of approximately 600 MHz-2.5 GHz (low band (LB), mid-band (MB) & high band (HB)) and over an approximate gain range of about 70 dB. However, the capacitor 450 may be implemented at other frequencies and over other gain ranges. In an exemplary embodiment, the capacitor 450 may be implemented at frequencies higher than, for example, 3 GHz. The capacitor 450, and the amplifier system 400, may be implemented in a single-ended implementation as shown in FIG. 4, or in a differential implementation.

In an exemplary embodiment, a phase displacement, also referred to as a phase lag, may be introduced between the current, $I_B$, flowing through the cascode FET 434, and the current $I_A$, which is the same as the current, flowing through the first FET 426, $M_A$. In an exemplary embodiment, separating the gm stage of the amplifier system 400 into two paths, the first current path 420 and the second current path 430, comprising the gm of the first FET 426, $M_A$, and the gm of the second FET 436, $M_B$, allows separate currents to flow through the first current path 420 and the second current path 430. Moreover, by coupling a capacitor 450 at the cascode node 435 of the second FET 436, $M_B$, a pole is formed at node 435, the pole formed by the gm of the cascode FET 434 and the capacitor 450. The pole formed at the node 435 can be used to introduce a phase displacement between the current, $I_B$, flowing through the cascode FET 434, with respect to the current, $I_A$, or $I_{A,in}$, flowing through the first FET 426, $M_A$, giving rise to a phase displacement between the first current, $I_A$, and the second current, $I_B$.

In an exemplary embodiment, the capacitor 450 can be adjustable, switchable, variable, or otherwise adjustable or programmable, and can be configured to create a variable and adjustable phase displacement between the current, $I_B$, that flows through the cascode FET 434, with respect to the current, $I_A$, that flows through the first FET 426, $M_A$. In an exemplary embodiment, the phase displacement creates a phase lag in the current, $I_B$, that flows through the cascode FET 434, with respect to the current, $I_A$, that flows through the first FET 426, $M_A$. In some embodiments, the capacitors 451 may be selected or deselected in accordance with a plurality of gain steps of the amplifier system 400.

There is a parasitic capacitance 423 associated with the first FET 426, $M_A$, and a parasitic capacitance 425 associated with the second FET 436, $M_B$. The parasitic capacitances 423 and 425 occur as a result of the MOSFET devices 426, 436 and 434, and signal line routing to and from the MOSFET devices 426, 436 and 434.

The parasitic capacitance 425 adds to any capacitance provided by the capacitor 450, and contributes to the pole formed at node 435 with the gm of the cascode FET 434 at a frequency ($g_{m,cascode}/C_{par,B}$) (unit:rad/sec). The processor 310 or other element providing control to the switches 453 may account for the parasitic capacitance 425 when determining the capacitance to be provided by the capacitor 450.

The pole formed at node 435 creates a phase lag in the current, $I_B$, flowing through the cascode FET 434, with respect to the current, $I_A$, flowing through the first FET 426, $M_A$.

In an exemplary embodiment, the higher the capacitance of the capacitor 450, the greater the phase lag in the current, $I_B$, that flows through the cascode FET 434, with respect to the current, $I_A$, that flows through the first FET 426, $M_A$.

In an exemplary embodiment, the value of the capacitor 450 is referred to as $C_{bank}$, and the phase lag of the current $I_B$ with respect to the current $I_{B,in}$ can be given by:

$$\text{Phase lag of } I_B \ \omega \cdot r \cdot t \ I_{B,in} = \tan^{-1}\left\{\frac{\omega \cdot (C_{par} + C_{bank})}{g_{in,cascode}}\right\}$$

In an exemplary embodiment, increasing the capacitance at the cascode node 435 using the capacitor 450 increases the phase lag of the current $I_B$ in the $M_B$ path. Therefore, there will be phase lag between $I_B$ and $I_A$ as given by:

$$\text{Phase lag of } I_B \ \omega \cdot r \cdot t \ I_A = \tan^{-1}\left\{\frac{\omega \cdot (C_{par} + C_{bank})}{g_{in,cascode}}\right\} - \tan^{-1}\left\{\frac{\omega \cdot C_{par}}{g_{in,cascode}}\right\}$$

However, in this exemplary embodiment where there is no cascode amplifier configuration in the first current path 420, the value of the term "$-\tan^{-1}\{\omega \cdot C_{par}/g_{m,cascode}\}$" will be zero. The phase lag of the current $I_B$ with respect to the current $I_A$ would be zero when the value of the capacitor 450, $C_{bank}$=0 and the parasitic capacitance 425 at the node 435 is zero ($C_{par}$=0). However, a non-zero parasitic capacitance may be present at the node 435 and results in a residual phase lag.

The parasitic capacitance, $C_{par}$, and $g_{m,cascode}$ in the first current path 420 and the second current path 430 could differ slightly and there could be a residual phase lag even without the capacitance of the capacitor 450, $C_{bank}$. The phase lag given in these expressions is in radians.

In an exemplary embodiment, the phase displacement between the current, $I_B$, with respect to the current, $I_A$, reduces or eliminates the third order intermodulation product, also referred to as IM3, that gives rise to two-tone third order intermodulation distortion, IMD3, thus linearizing the output of the amplifier.

In an exemplary embodiment, the amplifier system 400 may be implemented in a power amplifier pre-driver, a power amplifier driver, a power amplifier, a receive amplifier, a receiver low noise amplifier (LNA), or any amplifier device.

In an exemplary embodiment, the value of the capacitor 450 may be set between zero and a maximum capacitance. In an exemplary embodiment, the value of the capacitance 450 may be equal to, less than, or more than one picofarad (pF). In an exemplary embodiment, implementing the capacitor 450 avoids the use of additional inductances or inductors having multiple-taps. In an exemplary embodiment, the gate source voltage, $V_{gs}$, swings of the first FET 426, $M_A$, and the second FET 436, $M_B$, remain the same.

The embodiments of the amplifier system 400 provide for easy tunability and programmability across a range of frequency and gain states, use no additional electro-magnetic devices, such as inductors or inductances, and can easily be applied to power amplifier pre-drivers and drivers. Some embodiments may improve phase lag without a detrimental current increase, while reducing IM3 and/or maintaining or minimally reducing an output power.

Figure 5:
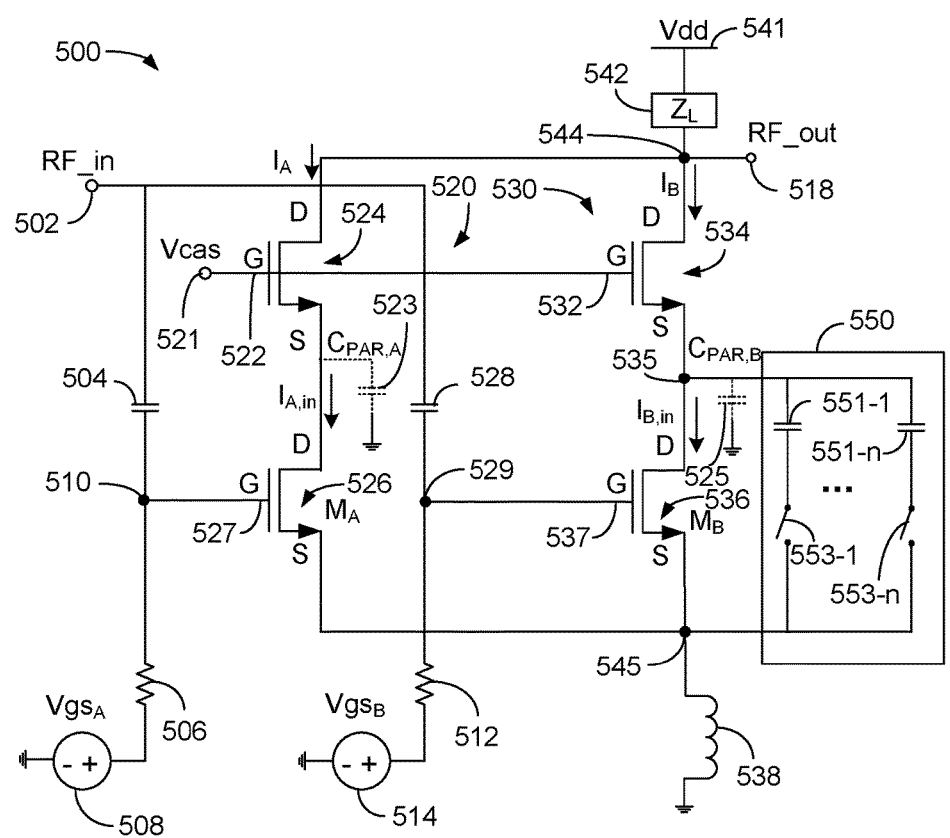
FIG. 5 is a schematic diagram illustrating an exemplary embodiment of an amplifier system.

FIG. 5 is a schematic diagram illustrating an exemplary embodiment of an amplifier system 500. The amplifier system 500 comprises a first current path 520 and a second current path 530. The first current path 520 comprises a first cascode FET 524 and a first FET 526, $M_A$, which is biased in weak to moderate inversion. The first FET 526 may be configured as a transconductance amplifier having a gain, and can also be referred to as a first "gm" stage. A gate 527 of the first FET 526 may be coupled to a node 510 that may be configured to receive a first bias voltage, $Vgs_A$ from a voltage source 508 through a resistor 506.

The second current path 530 comprises a second cascode FET 534, and a second FET 536, $M_B$, which is biased in strong inversion. The second FET 536 may be configured as a transconductance amplifier having a gain, and can also be referred to as a second "gm" stage. A gate 537 of the second FET 536 may be coupled to a node 529 that may be configured to receive a second bias voltage, $Vgs_B$ from a voltage source 514 through a resistor 512.

A radio frequency (RF) input signal, RF_in. may be provided to a node 502, and may be provided to the gate 527 of the first FET 526 through a capacitor 504, and to the gate 537 of the second FET 536 through a capacitor 528. In an exemplary embodiment, the capacitor 504 and the capacitor 528 may be configured as DC blocking capacitors.

In an exemplary embodiment, the drain of the first cascode FET 524 and the drain of the second cascode FET 534 are coupled to a node 544. A characteristic load impedance, $Z_L$, 542 is coupled to the node 544 and receives a system voltage Vdd, over connection 541. The gate 522 of the first cascode FET 524 and the gate 532 of the second cascode FET 534 are coupled to a bias voltage, Vcas, at a node 521. The drain of the first FET, $M_A$, 526 is coupled to the source of the first cascode FET 524. A radio frequency (RF) output is taken from a node 518.

The drain of the second FET 536, $M_B$, is coupled to the source of the second cascode FET 534. The source of the second FET 536, $M_B$, and the source of the first FET 526, $M_A$, are coupled to a node 545. An inductor 538 is also coupled to the node 545 and to ground, and may be configured as a degeneration inductor. In some embodiments the inductor 538 is omitted or is inherently present in trace routing and thus is not implemented as a separate component.

A node 535 is created between the drain of the second FET 536, $M_B$, and the source of the second cascode FET 534. A capacitor 550 is coupled between the node 535 and the source of the first FET 526, $M_A$, and the source of the second FET 536, $M_B$ at node 545. In other embodiments, the capacitor 550 may instead be coupled across the first FET 526, $M_A$, or there may be capacitors coupled across each of the first FET 526, $M_A$, and the second FET 536, $M_B$.

A first current, $I_A$, flows in the first current path 520, and a second current, $I_B$, flows in the second current path 530. In an exemplary embodiment shown in FIG. 5 where the first current path 520 comprises a cascode amplifier configuration, a current flowing through the first FET 526, $M_A$, may be referred to as $I_{A,in}$. In the embodiment shown in FIG. 5, the second current path 530 also comprises a cascode amplifier configuration, so a current, $I_{B,in}$ flows through the second FET 536, $M_B$.

In an exemplary embodiment, the capacitor 550 may be a variable, a switchable, an adjustable or a programmable capacitor bank comprising a plurality of capacitors or capacitances 551-1 through 551-$n$, where "n" may be any integer. The capacitances 551-1 through 551-$n$ may be switched using respective switches 553-1 through 553-$n$. The switches 553-1 through 553-$n$ may be controlled by a control signal from, for example, the data processor 310 (FIG. 3) or a processor local to the transceiver 320 or within a module implemented the PA 344. In an exemplary embodiment, the capacitor 550 may be operable over a range of frequencies and a range of gain states of the first FET 526, $M_A$, and the second FET 536, $M_B$. The capacitor 550, and the amplifier system 500, may be implemented in a single-ended implementation or in a differential implementation.

In an exemplary embodiment, a phase displacement, also referred to as a phase lag, may be introduced between the current, $I_B$, flowing through the second cascode FET 534, and the current $I_A$, flowing through the first cascode FET 524. In an exemplary embodiment, separating the gm stage of the amplifier system 500 into two paths, the first current path 520 and the second current path 530, comprising the gm of the first FET 526, $M_A$, and the gm of the second FET 536, $M_B$, allows separate currents to flow through the first current path 520 and the second current path 530. Moreover, by coupling a capacitor 550 at the cascode node 535 of the second FET 536, $M_B$, a pole is formed at node 535, the pole formed by the gm of the cascode FET 534 and the capacitor 550. The pole formed by the node 535 can be used to introduce a phase displacement between the current, $I_B$, flowing through the second cascode FET 534, and the current $I_A$, flowing through the first cascode FET 524.

In an exemplary embodiment, the capacitor 550 can be adjustable or variable and can be configured to create a variable and adjustable phase displacement between the current $I_B$, that flows through the second cascode FET 534, with respect to the current $I_A$, that flows through the first cascode FET 524. In an exemplary embodiment, the phase displacement creates a phase lag in the current, $I_B$, that flows through the second cascode FET 534, with respect to the current, $I_A$, that flows through the first cascode FET 524. In some embodiments, the capacitors 551 may be selected or deselected in accordance with a plurality of gain steps of the amplifier system 500.

There is a parasitic capacitance 523 associated with the first FET 526, $M_A$, and a parasitic capacitance 525 associated with the second FET 536, $M_B$. The parasitic capacitances 523 and 525 occur as a result of the MOSFET devices 526 and 536, the cascode devices 524 and 534, and signal line routing to and from the MOSFET devices 526 and 536 and the cascode devices 524 and 534.

The parasitic capacitance 525 adds to any capacitance provided by the capacitor 550, and contributes to the pole formed at node 535 with the gm of the second cascode FET 534 at a frequency ($g_{m,cascode}/C_{par,B}$) (unit:rad/sec). The pole formed at node 535 creates a phase lag in the current, $I_B$, flowing through the second cascode FET 534, and the current $I_A$, flowing through the first cascode FET 524.

In an exemplary embodiment, the higher the capacitance of the capacitor 550, the greater the phase lag in the current, $I_B$, that flows through the second cascode FET 534, with respect to the current, $I_A$, that flows through the first cascode FET 524.

In an exemplary embodiment, the value of the capacitor 550 is referred to as $C_{bank}$, and the phase lag of the current $I_A$ with respect to the current $I_{A,in}$ can be given by:

$$\text{Phase lag of } I_A \ w.r.t \ I_{A,in} = \tan^{-1}\left\{\frac{\omega \cdot C_{par}}{g_{in,cascode}}\right\}$$

In an exemplary embodiment, the value of the capacitor 550 is referred to as $C_{bank}$, and the phase lag of the current $I_B$ with respect to the current $I_{B,in}$ can be given by:

$$\text{Phase lag of } I_B \ w.r.t \ I_{B,in} = \tan^{-1}\left\{\frac{\omega \cdot (C_{par} + C_{bank})}{g_{in,cascode}}\right\}$$

In an exemplary embodiment, increasing the capacitance at the cascode node 535 using the capacitor 550 increases the phase lag of the current $I_B$ in the second current path 530, i.e., the $M_B$ path. Therefore, there will be phase lag between $I_B$ and $I_A$ as given by:

$$\text{Phase lag of } I_B \ \omega \cdot r \cdot t \ I_A = \tan^{-1}\left\{\frac{\omega \cdot (C_{par} + C_{bank})}{g_{in,cascode}}\right\} - \tan^{-1}\left\{\frac{\omega \cdot C_{par}}{g_{in,cascode}}\right\}$$

The phase lag of the current $I_B$ with respect to the current $I_A$ would be zero when the value of the capacitor 550, $C_{bank}=0$ and the parasitic capacitances in the two current paths 520 and 530 are the same ($C_{parA}=C_{parB}$)

The parasitic capacitance, $C_{par}$, and $g_{m,cascode}$ in the first current path 520 and the second current path 530 could differ slightly and there could be a residual phase lag even without the capacitance of the capacitor 550, $C_{bank}$. The phase lag given in these expressions is in radians. In an exemplary embodiment, the phase displacement between the current, $I_B$, with respect to the current, $I_A$, reduces or eliminates the third order intermodulation product, also referred to as IM3, that gives rise to two-tone third order intermodulation distortion, IMD3 thus linearizing the output of the amplifier.

In an exemplary embodiment, the amplifier system 500 may be implemented in a power amplifier pre-driver, a power amplifier driver, a power amplifier, a receive amplifier, a receiver low noise amplifier (LNA), or any amplifier device. In an exemplary embodiment, the value of the capacitor 550 may be set between zero and a maximum capacitance. In an exemplary embodiment, the value of the capacitance 550 may be equal to, less than, or greater than one picofarad (pF). In an exemplary embodiment, implementing the capacitor 550 avoids the use of additional inductances or inductors having multiple-taps.

In an exemplary embodiment, the gate source voltage, $V_{gs}$, swings of the first FET 526, $M_A$, and the second FET 536, $M_B$, remain the same. The embodiments of the amplifier system 500 provide for easy tunability and programmability across a range of frequency and gain states, use no additional electro-magnetic devices, such as inductors or inductances, and can easily be applied to power amplifier pre-drivers and drivers. Some embodiments may improve phase lag without a detrimental current increase, while reducing IM3 and/or maintaining or minimally reducing an output power.

Figure 6:
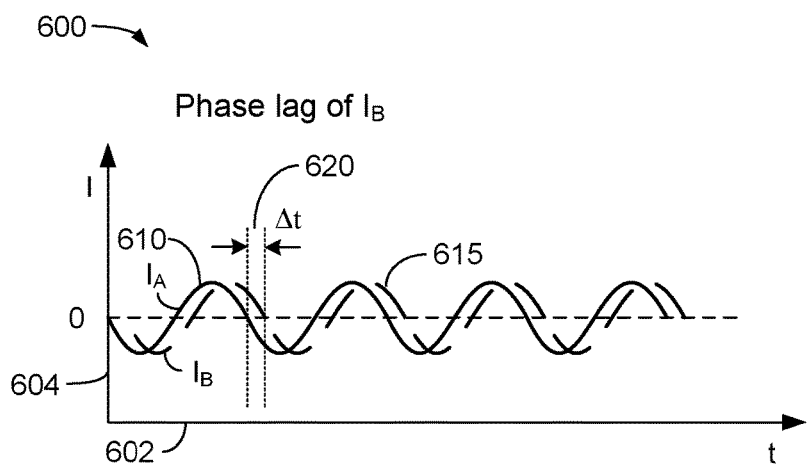
FIG. 6 is a graph showing an example of current flowing in the amplifier systems of FIG. 4 and FIG. 5.

FIG. 6 is a graph 600 showing an example of the current flowing in the amplifier systems of FIG. 4 and FIG. 5. The abscissa 602 shows time and the ordinate 604 shows relative current. The trace 610 represents the current, $I_A$, flowing in the first cascode FET 524 (FIG. 5) or the current, $I_A$, flowing in the first FET 426, $M_A$ (FIG. 4), and the trace 615 represents the current, $I_B$, flowing in the second cascode FET 534 (FIG. 5) or the current, $I_B$, flowing in the cascode FET 434 (FIG. 4). Referring to FIG. 5, in an exemplary embodiment, the current $I_B$, flowing in the second cascode FET 534, lags the current $I_A$, flowing in the first cascode FET 524, by an amount Δt 620, that represents a time domain representation of a phase lag in radians between the current $I_B$ and the current $I_A$ caused by the capacitor 450 (FIG. 4) or 550 (FIG. 5). The value of the capacitor 450 (FIG. 4) or 550 (FIG. 5) determines the amount of phase lag 620 and may be set to linearize the output of the amplifier, for example by reduces or eliminating IM3 through appropriately establishing phase displacement.

Figure 7:
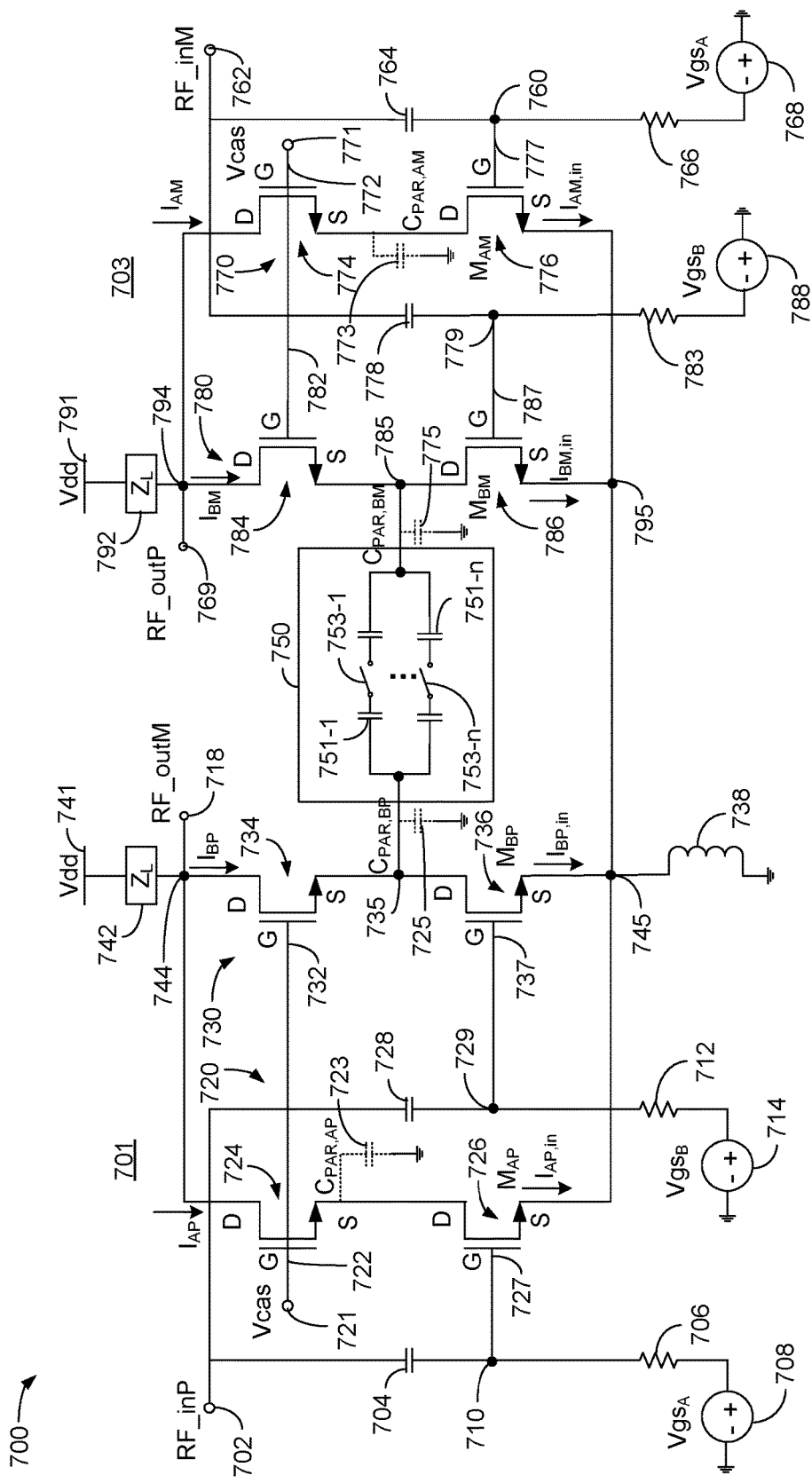
FIG. 7 is a schematic diagram illustrating an exemplary embodiment of an amplifier system.

FIG. 7 is a schematic diagram illustrating an exemplary embodiment of an amplifier system 700. The amplifier system 700 comprises an exemplary embodiment of a differential application of the amplifier system 500 of FIG. 5. The amplifier system 700 comprises a first differential circuit 701 and a second differential circuit 703. In an exemplary embodiment, the terms "P" and "M" will be used to denote the differential aspect of the amplifier system 700. For example, the term "P" may represent a "positive" waveform and the term "M" may represent the inverse of the positive waveform. Other nomenclature may be used, such as, for example only, "+" and "−".

The first differential circuit 701 of the amplifier system 700 comprises a first P current path 720 and a second P current path 730. The first P current path 720 comprises a first cascode FET 724 and a first FET 726, $M_{AP}$, which is biased in weak to moderate inversion. The first FET 726 $M_{AP}$, may be configured as a transconductance amplifier having a gain, and can also be referred to as a first "gm" stage. A gate 727 of the first FET 726 may be coupled to a node 710 that may be configured to receive a first bias voltage, $Vgs_A$ from a voltage source 708 through a resistor 706.

The second P current path 730 comprises a second cascode FET 734, and a second FET 736, $M_{BP}$, which is biased in strong inversion. The second FET 736 may be configured as a transconductance amplifier having a gain, and can also be referred to as a second "gm" stage. A gate 737 of the second FET 736 may be coupled to a node 729 that may be configured to receive a second bias voltage, $Vgs_B$ from a voltage source 714 through a resistor 712.

There is a parasitic capacitance 723 associated with the first FET 726 $M_{AP}$, and a parasitic capacitance 725 associated with the second FET 736, $M_{BP}$. The parasitic capacitances 723 and 725 occur as a result of the MOSFET devices 726, 736, 724 and 734, and signal line routing to and from the MOSFET devices 726, 736, 724 and 734.

A radio frequency (RF) input signal, RF_inP, may be provided to a node 702, and may be provided to the gate 727 of the first FET 726 through a capacitor 704, and to the gate 737 of the second FET 736 $M_{BP}$, through a capacitor 728. In an exemplary embodiment, the capacitor 704 and the capacitor 728 may be configured as DC blocking capacitors.

In an exemplary embodiment, the drain of the first cascode FET 724 and the drain of the second cascode FET 734 are coupled to a node 744. A characteristic load impedance, $Z_L$, 742 is coupled to the node 744 and receives a system voltage Vdd, over connection 741. The gate 722 of the first cascode FET 724 and the gate 732 of the second cascode FET 734 are coupled to a bias voltage, Vcas, at a node 721. The drain of the first FET, $M_{AP}$, 726 is coupled to the source of the first cascode FET 724. A radio frequency (RF) output, RF_outM, is taken from a node 718.

The drain of the second FET 736, $M_{BP}$, is coupled to the source of the cascode FET 734. The source of the second FET 736, $M_{BP}$, and the source of the first FET 726, $M_{AP}$, are coupled to a node 745. An inductor 738 is also coupled to the node 745 and to ground, and may be configured as a source degeneration inductor. In some embodiments the inductor 738 is omitted or is inherently present in trace routing and thus is not implemented as a separate component. A node 735 is created between the drain of the second FET 736, $M_{BP}$, and the source of the second cascode FET 734.

The second differential circuit 703 of the amplifier system 700 comprises a first M current path 770 and a second M current path 780. The first M current path 770 comprises a first cascode FET 774 and a first FET 776, $M_{AM}$, which is biased in weak to moderate inversion. The first FET 776 may be configured as a transconductance amplifier having a gain, and can also be referred to as a first "gm" stage. A gate 777 of the first FET 776 may be coupled to a node 760 that may be configured to receive a first bias voltage, $Vgs_A$ from a voltage source 768 through a resistor 766.

The second M current path 780 comprises a second cascode FET 784, and a second FET 786, $M_{BM}$, which is biased in strong inversion. The second FET 786 may be configured as a transconductance amplifier having a gain, and can also be referred to as a second "gm" stage. A gate 787 of the second FET 786 may be coupled to a node 779 that may be configured to receive a second bias voltage, $Vgs_B$ from a voltage source 788 through a resistor 783.

There is a parasitic capacitance 773 associated with the first FET 776 $M_{AM}$, and a parasitic capacitance 775 associated with the second FET 786, $M_{BM}$. The parasitic capacitances 773 and 775 occur as a result of the MOSFET devices 776, 786, 774 and 784, and signal line routing to and from the MOSFET devices 776, 786, 774 and 784.

A radio frequency (RF) input signal, RF inM, may be provided to a node 762, and may be provided to the gate 777 of the first FET 776 through a capacitor 764, and to the gate 787 of the second FET 786 through a capacitor 778. In an exemplary embodiment, the capacitor 764 and the capacitor 778 may be configured as DC blocking capacitors.

In an exemplary embodiment, the drain of the first cascode FET 774 and the drain of the second cascode FET 784 are coupled to a node 794. A characteristic load impedance, $Z_L$, 792 is coupled to the node 794 and receives a system voltage Vdd, over connection 791. The gate 772 of the first cascode FET 774 and the gate 782 of the second cascode FET 784 are coupled to a bias voltage, Vcas, at a node 771. The drain of the first FET, $M_{AM}$, 776 is coupled to the source of the first cascode FET 774. A radio frequency (RF) output, RF_outP, is taken from a node 769.

The drain of the second FET 786, $M_{BM}$, is coupled to the source of the cascode FET 784. The source of the second FET 786, $M_{BM}$, and the source of the first FET 776, $M_{AM}$, are coupled to a node 795. The inductor 738 is also coupled to the node 795 and to ground, and may be configured as a source degeneration inductor.

A node 785 is created between the drain of the second FET 786, $M_B$, and the source of the second cascode FET 784. A capacitor 750 is coupled between the node 735 and the node 785.

A first current, $I_{AP}$, flows in the first P current path 720, and a second current, $I_{BP}$, flows in the second P current path 730. A first current, $I_{AM}$, flows in the first M current path 770, and a second current, $I_{BM}$, flows in the second M current path 780.

In an exemplary embodiment shown in FIG. 7 where the first P current path 720 and the first M current path 770 comprise a cascode amplifier configuration, a current flowing through the first FET 726, $M_{AP}$, may be referred to as $I_{AP,in}$ and a current flowing through the first FET 776, $M_{AM}$ may be referred to as $I_{AM,in}$.

In the embodiment shown in FIG. 7, the second P current path 730 and the second M current path 780 also comprise a cascode amplifier configuration, so a current, $I_{BP,in}$, flows through the second FET 736, $M_{BP}$ and a current, $I_{BM,in}$, flows through the second FET 786, $M_{BM}$.

In an exemplary embodiment, the capacitor 750 may be a variable, a switchable, an adjustable or a programmable capacitor bank comprising a plurality of capacitors or capacitances 751-1 through 751-n, where "n" may be any integer. The capacitances 751-1 through 751-n may be switched using respective switches 753-1 through 753-n. The switches 753-1 through 753-n may be controlled by a control signal from, for example, the data processor 310 (FIG. 3). In an exemplary embodiment, the capacitor 750 may be operable over a range of frequencies and a range of gain states of the first FET 726, $M_{AP}$, the second FET 736, $M_{BP}$ the first FET 776, $M_{AM}$, and the second FET 786, $M_{BM}$.

In an exemplary embodiment, a phase displacement, also referred to as a phase lag, may be introduced between the current, $I_{BP,in}$, flowing through the second FET 736, $M_{BP}$, and the current $I_{AP,in}$, flowing through the first FET 726, $M_A$. In an exemplary embodiment, separating the gm stage of the amplifier system 700 into two paths for each differential circuit 701 and 703, i.e., the first P current path 720 and the second P current path 730, comprising the gm of the first FET 726, $M_{AP}$, and the gm of the second FET 736, $M_{BP}$, and the first M current path 770 and the second M current path 780, comprising the gm of the first FET 776, $M_{AM}$, and the gm of the second FET 786, $M_{BM}$, allows separate currents to flow through the first P current path 720 and the second P current path 730, and the first M current path 770 and the second M current path 780.

Moreover, by coupling a capacitor 750 at the cascode node 735 of the second FET 736, $M_{BP}$, and the cascode node 785 of the second FET 786, $M_{BM}$, a pole is formed at the nodes 735 and 785, the pole formed by the gm of the cascode FET 734 and the capacitor 750 and the gm of the cascode FET 784 and the capacitor 750.

The pole formed at the node 735 can be used to introduce a phase displacement between the current, $I_{BP}$, flowing through the second cascode FET 734, with respect to the current, $I_{AP}$, flowing through the first cascode FET 724. Similarly, the pole formed by the node 785 can be used to introduce a phase displacement between the current $I_{BM}$, flowing through the second cascode FET 784, with respect to the current, $I_{AM}$, flowing through the first cascode FET 774.

In an exemplary embodiment, the capacitor 750 can be adjustable or variable and can be configured to create a variable and adjustable phase displacement between the current, $I_{BP}$, that flows through the second cascode FET 734, with respect to the current, $I_{AP}$, that flows through the first cascode FET 724 and can be configured to create a variable and adjustable phase displacement between the current, $I_{BM}$, that flows through the second cascode FET 784, with respect to the current, $I_{AM}$, that flows through the first cascode FET 774.

The parasitic capacitance 725 adds to any capacitance provided by the capacitor 750, and contributes to the pole formed at node 735 with the gm of the cascode device (the second FET 736, $M_{BP}$, at a frequency ($g_{m,cascode}/C_{par,B}$) (unit:rad/sec). Similarly, the parasitic capacitance 775 adds to any capacitance provided by the capacitor 750, and contributes to the pole formed at node 785 with the gm of the cascode device (the second FET 786, $M_{BM}$, at a frequency ($g_{m,cascode}/C_{par,B}$) (unit:rad/sec).

In an exemplary embodiment, the higher the capacitance of the capacitor 750, the greater the phase lag in the current, $I_{BP}$, that flows through the second cascode FET 734, with respect to the current, $I_{AP}$, that flows through the first cascode FET 724 and the greater the phase lag in the current, $I_{BM}$, that flows through the second cascode FET 784, with respect to the current, $I_{AM}$, that flows through the first cascode FET 774.

In an exemplary embodiment, the value of the capacitor 750 is referred to as $C_{bank}$, and the phase lag of the current $I_{AP}$ with respect to the current $I_{AP,in}$ and the phase lag of the current $I_{AM}$ with respect to the current $T_{AM,in}$ can be given by:

$$\text{Phase lag of } I_A \; \omega \cdot r \cdot t \; I_{A,in} = \tan^{-1}\left\{\frac{\omega \cdot C_{par}}{g_{in,cascode}}\right\}$$

In an exemplary embodiment, the value of the capacitor 750 is referred to as $C_{bank}$, and the phase lag of the current $I_{BP}$ with respect to the current $I_{BP,in}$ and the phase lag of the current $I_{BM}$ with respect to the current $I_{AM,in}$ can be given by:

$$\text{Phase lag of } I_B \; \omega \cdot r \cdot t \; I_{B,in} = \tan^{-1}\left\{\frac{\omega \cdot (C_{par} + C_{bank})}{g_{in,cascode}}\right\}$$

In an exemplary embodiment, increasing the capacitance at the cascode node 735 and the node 785 using the capacitor 750 increases the phase lag of the current $I_{BP}$ in the $M_{BP}$ path and increase the phase lag of the current $I_{BM}$ in the $M_{BM}$ path. Therefore, the phase lag between $I_{BP}$ and $I_{AP}$ and the phase lag between $I_{BM}$ and $I_{AM}$ is given by:

$$\text{Phase lag of } I_B \; \omega \cdot r \cdot t \; I_A = \tan^{-1}\left\{\frac{\omega \cdot (C_{par} + C_{bank})}{g_{in,cascode}}\right\} - \tan^{-1}\left\{\frac{\omega \cdot C_{par}}{g_{in,cascode}}\right\}$$

Moreover, the phase lag of the current $I_{BP}$ with respect to the current $I_{AP}$ and the phase lag of the current $I_{BM}$ with respect to the current $I_{AM}$ would be zero when the value of the capacitor 750, $C_{bank}$=0 and the parasitic capacitances in the two paths are the same ($C_{parA}$=$C_{parB}$).

The parasitic capacitance, $C_{par}$, and $g_{m,cascode}$ in the first P current path 720 and the second P current path 730, and in the first M current path 770 and the second M current path 780 could differ slightly and there could be a residual phase lag even without the capacitance of the capacitor 750, $C_{bank}$. The phase lag given in these expressions is in radians.

In an exemplary embodiment, the phase displacement between the current, $I_{BP}$, with respect to the current, $I_{AP}$, and the phase displacement between the current, $I_{BM}$, with respect to the current, $I_{AM}$ reduces or eliminates the third order intermodulation product, also referred to as IM3, that gives rise to two-tone third order intermodulation distortion, IMD3 thus linearizing the output of the amplifier.

In an exemplary embodiment, the amplifier system 700 may be implemented in a power amplifier pre-driver, a power amplifier driver, a power amplifier, a receive amplifier, a receiver low noise amplifier (LNA), or any amplifier device.

In an exemplary embodiment, the value of the capacitor 750 may be set between zero and a maximum capacitance. In an exemplary embodiment, the value of the capacitance 750 may be equal, less than, or greater than one picofarad (pF). In an exemplary embodiment, implementing the capacitor 750 avoids the use of additional inductances or inductors having multiple-taps.

In an exemplary embodiment, the gate source voltage, $V_{gs}$, swings of the first FET 726, $M_{AP}$, and the second FET 736, $M_{BP}$, and the gate source voltage, $V_{gs}$, swings of the first FET 776, $M_{AM}$, and the second FET 786, $M_{BM}$ remain the same.

The embodiments of the amplifier system 700 provide for easy tunability and programmability across a range of frequency and gain states, use no additional electro-magnetic devices, such as inductors or inductances, and can easily be applied to power amplifier pre-drivers and drivers. Some embodiments may improve phase lag without a detrimental current increase, while reducing IM3 and/or maintaining or minimally reducing an output power.

Figure 8:
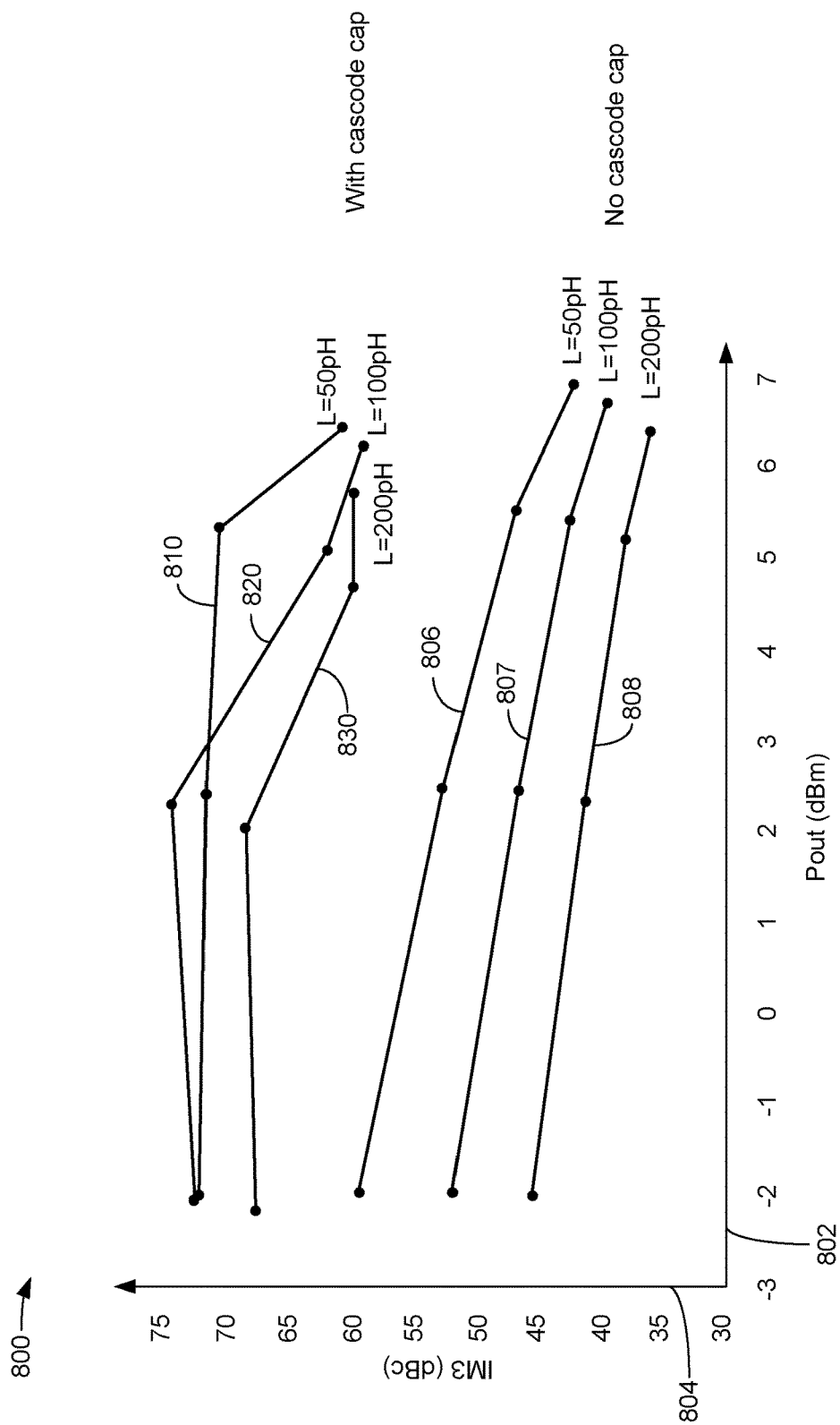
FIG. 8 is a graph showing examples of the operation of the amplifier system of FIG. 7.

FIG. 8 is a graph showing examples of the operation of the amplifier system of FIG. 7 according to one particular implementation of the embodiments described therein. Those of skill in the art will recognize that other implementations are possible and that the examples and values described with respect to FIG. 7 are not limiting. The abscissa 802 shows power output in dBm (Pout(dBm)) and the ordinate 804 shows third order intermodulation in dBc (IM3 (dBc)).

The traces 806, 807 and 808 illustrate the IM3 performance of an amplifier with respective degeneration inductances of 50 pH, 100 pH and 20 pH, with no capacitance coupled to the cascode node.

The trace 810 illustrates the IM3 performance of an amplifier with a degeneration inductance of 50 pH and an exemplary capacitance coupled to the cascode node as described herein. An example of a capacitance value may be from about zero to about 1 pF. The trace 820 illustrates the IM3 performance of an amplifier with a degeneration inductance of 100 pH and an exemplary capacitance coupled to the cascode node as described herein. The trace 830 illustrates the IM3 performance of an amplifier with a degeneration inductance of 200 pH and an exemplary capacitance coupled to the cascode node as described herein. An example of a capacitance value may be from about zero capacitance to up to 1 pF. As shown the IM3 performance at an exemplary power output of 5 dBm is on the order of about 20 dB better when a capacitance is coupled to a cascode node of a power amplifier.

Figure 9:
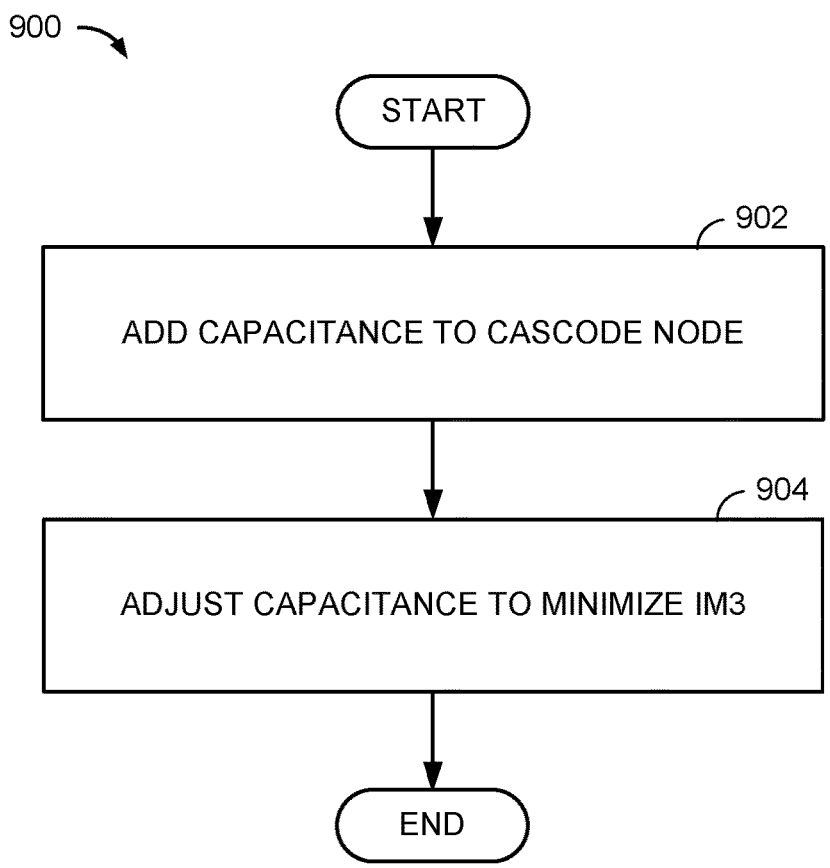
FIG. 9 is a flow chart describing the operation of an exemplary embodiment of an amplifier system.

FIG. 9 is a flow chart 900 describing the operation of an exemplary embodiment of an amplifier system. The blocks in the method 900 can be performed in or out of the order shown, and in some embodiments, can be performed at least in part in parallel.

In block 902, a capacitance is added to a cascode node of an amplifier. In an exemplary embodiment, the capacitance may be a variable, or adjustable capacitance, or a variable or adjustable capacitor bank. In block 904, the capacitance is adjusted to minimize third order intermodulation distortion IMD3 in the amplifier. For example, the data processor 310 or another processor or controller may cause the capacitance to be added and/or adjusted.

Figure 10:
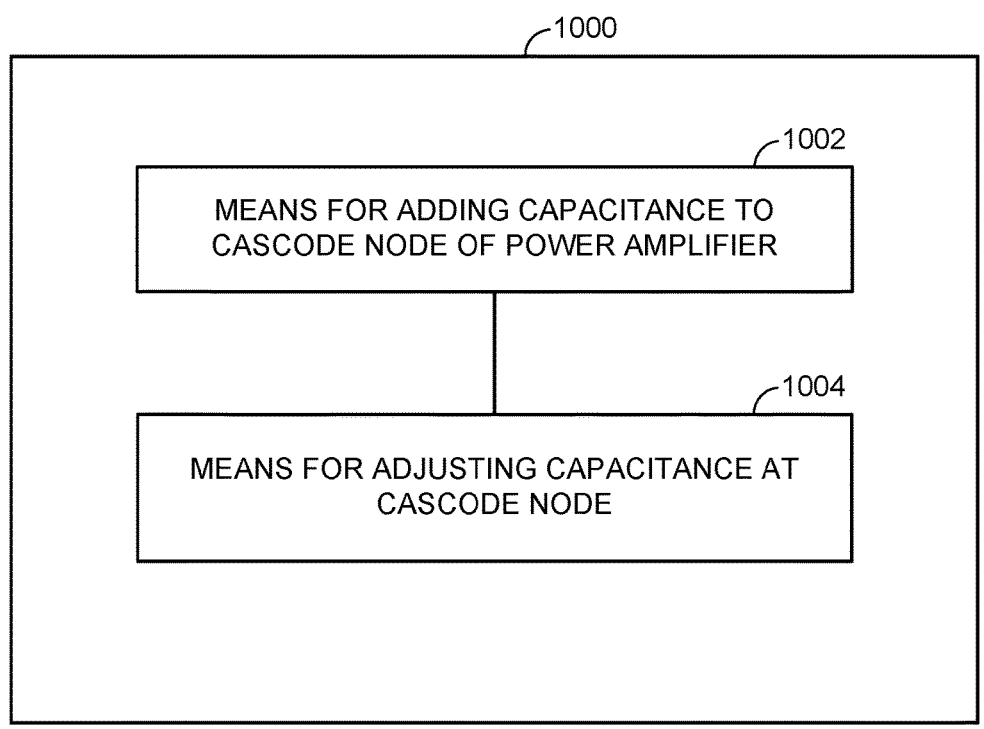
FIG. 10 is a functional block diagram of an apparatus for an amplifier system.

FIG. 10 is a functional block diagram of an apparatus 1000 for an amplifier system. The apparatus 1000 comprises means 1002 for adding capacitance to a cascode node of an amplifier. In certain embodiments, the means 1002 for adding capacitance to a cascode node of an amplifier can be configured to perform the function described in operation block 902 of method 900 (FIG. 9). In an exemplary embodiment, the means 1002 for adding capacitance to a cascode node of an amplifier may comprise the capacitance added to the cascode node of the amplifier system shown in FIG. 4, FIG. 5 and FIG. 7, and/or a processor or controller for causing such capacitance to be added, and/or various embodiments thereof.

The apparatus 1000 further comprises means 1004 for adjusting the capacitance at the cascode node of the amplifier. In certain embodiments, the means 1004 for adjusting the capacitance at the cascode node of the amplifier can be configured to perform the function described in operation block 904 of method 900 (FIG. 9). In an exemplary embodiment, the means 1004 for adjusting the capacitance at the cascode node of the amplifier may comprise elements for adjusting the capacitance added to the cascode node of the amplifier system shown in FIG. 4, FIG. 5, and FIG. 7, for example a processor or controller or switches coupled to various capacitors, and/or various embodiments thereof.

Figure 11:
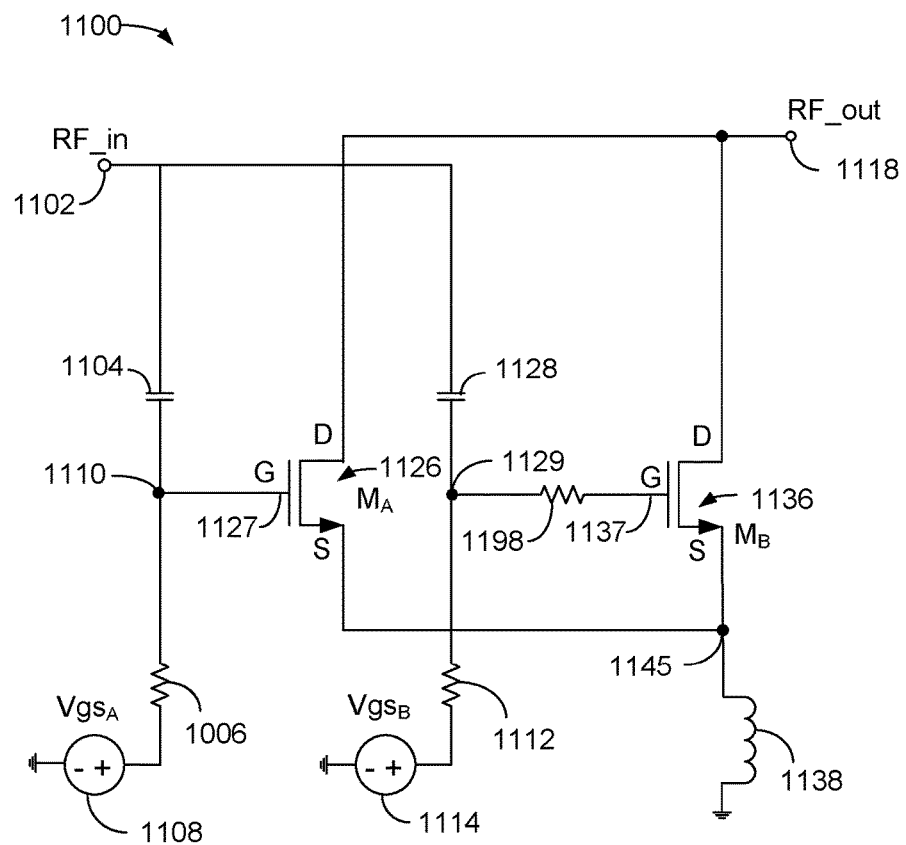
FIG. 11 is a schematic diagram illustrating an exemplary embodiment of an amplifier system.

FIG. 11 is a schematic diagram illustrating an exemplary embodiment of an amplifier system 1100. The amplifier system 1100 comprises a first FET 1126, $M_A$, which is biased in weak to moderate inversion ($V_{Gs}$<threshold voltage, ($V_{th}$)). The first FET 1126, $M_A$, may be configured as a transconductance amplifier having a gain, and can also be referred to as a first "gm" stage. A gate 1127 of the first FET 1126, $M_A$, may be coupled to a node 1110 that may be configured to receive a first bias voltage, $Vgs_A$ from a voltage source 1108 through a resistor 1106.

The amplifier system 1100 further comprises a second FET 1136, $M_B$, which is biased in strong inversion ($V_{Gs}$>$V_{th}$). The second FET 1136, $M_B$, may be configured as a transconductance amplifier having a gain, and can also be referred to as a second "gm" stage. A gate 1137 of the second FET 1136, $M_B$, may be coupled to a node 1129 that may be configured to receive a second bias voltage, $Vgs_B$ from a voltage source 1114 through a resistor 1112. Further, a resistor 1198 may be coupled between the node 1129 and the gate 1137.

A radio frequency (RF) input signal, RF_in, may be provided to a node 1102, and may be provided to the gate 1127 of the first FET 1126, $M_A$, through a capacitor 1104, and to the gate 1137 of the second FET 1136, $M_B$, through a capacitor 1128. In an exemplary embodiment, the capacitor 1104 and the capacitor 1128 may be configured as DC blocking capacitors.

In an exemplary embodiment, the drains of the first FET 1126, $M_A$, and the second FET 1136, $M_B$, are coupled to a radio frequency (RF) output, RF_out, at node 1118. An inductor 1138 is also coupled to the node 1145 and to ground, and may be configured as a source degeneration inductor. In some embodiments the inductor 1138 is omitted or is inherently present in trace routing and thus is not implemented as a separate component.

Some embodiments of the amplifier system 1100 will introduce phase-lag in the path through the second FET 1136, $M_B$, for example due to the resistor 1198 in series with the gate 1137 of the second FET 1136, $M_B$. The resistor 1198 and gate-cap may form a pole introducing the phase-lag.

The embodiments of the amplifier systems described herein can be configured to provide variable capacitance to an amplifier or an amplifier system, for example to reduce third order intermodulation (IM3), and to reduce third order intermodulation distortion (IMD3) at an output of an amplifier.

The amplifier systems described herein may be implemented on one or more ICs, analog ICs, RFICs, mixed-signal ICs, ASICs, printed circuit boards (PCBs), electronic devices, etc. The amplifier systems may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the amplifier systems described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

As used in this description, the terms "component," "database," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

Although selected aspects have been illustrated and described in detail, it will be understood that various substitutions and alterations may be made therein without departing from the spirit and scope of the present invention, as defined by the following claims.

What is claimed is:

1. A circuit, comprising:
a first amplifier path comprising a first amplifier, $M_A$;

a second amplifier path comprising a cascode device and a second amplifier, $M_B$;

a node defined by a source of the cascode device and a drain of the second amplifier, $M_B$;

a capacitance coupled between the node and a source of the second amplifier, $M_B$; and an input configured to receive a radio frequency signal, the input being coupled to a gate of the first amplifier, $M_A$, and to a gate of the second amplifier, $M_B$.

2. The circuit of claim 1, wherein:

the first amplifier path is configured to carry a first current, $I_A$;

the second amplifier path is configured to carry a second current, $I_B$; and the capacitance is configured to create a phase displacement between the second current, $I_B$, and the first current, $I_A$.

3. The circuit of claim 2, wherein the phase displacement between the second current, $I_B$, and the first current, $I_A$ reduces a third order intermodulation (IM3) component in an output of the first amplifier, $M_A$, and the second amplifier, $M_B$.

4. The circuit of claim 2, wherein the phase displacement between the second current, $I_B$, and the first current, $I_A$ comprises a phase lag in the second current, $I_B$, with respect to the first current, $I_A$.

5. The circuit of claim 1, wherein the capacitance is programmable over a range of frequencies and a range of gain states.

6. The circuit of claim 1, wherein a value of the capacitance is between zero and one picofarad (pF).

7. The circuit of claim 1, further comprising:

an additional cascode device located in the first amplifier path such that the first amplifier path and the second amplifier path each comprise a cascode amplifier arrangement.

8. The circuit of claim 1, wherein the circuit is single-ended.

9. The circuit of claim 1, wherein the circuit is differential.

10. The circuit of claim 1, wherein the capacitance further comprises a switchable capacitor.

11. The circuit of claim 10, wherein the switchable capacitor comprises a capacitor bank having a plurality of switchable capacitors.

12. A circuit, comprising:

means for providing adjustable capacitance at a cascode node of an amplifier, the amplifier having a first amplifier path comprising a first amplifier, $M_A$ and a second amplifier path comprising a cascode device and a second amplifier, $M_B$;

means for adjusting the capacitance at the cascode node to minimize third order intermodulation distortion (IMD3) in the amplifier; and input means for receiving a radio frequency signal, the input means being coupled to a gate of the first amplifier, $M_A$, and to a gate of the second amplifier, $M_B$.

13. The circuit of claim 12, further comprising:

means for conducting a first current, $I_A$, in a first amplification path; and means for conducting a second current, $I_B$, in a second amplification path, wherein the means for adjusting the capacitance to minimize third order intermodulation distortion (IMD3) in the amplifier creates a phase displacement between the second current, $I_B$, and the first current, $I_A$.

14. The circuit of claim 13, wherein the means for adjusting the capacitance creates a phase lag in the second current, $I_B$, with respect to the first current, $I_A$.

15. The circuit of claim 12, wherein the means for adjusting the capacitance comprises switchable capacitance means.

16. A method for an amplifier, comprising:

amplifying a signal in a first amplifier path carrying a first current, $I_A$;

amplifying the signal in a second amplifier path carrying a second current, $I_B$;

adjusting a capacitance at a cascode node of the second amplifier path to reduce third order intermodulation distortion (IMD3) in the amplifier; and providing a radio frequency signal to an input, the input being coupled to a gate of a first amplifier, $M_A$, in the first amplifier path and to a gate of a second amplifier, $M_B$ in the second amplifier path.

17. The method of claim 16, wherein adjusting the capacitance to reduce third order intermodulation distortion (IMD3) in the amplifier comprises creating a phase displacement between the second current, $I_B$, and the first current, $I_A$.

18. The method of claim 17, wherein the phase displacement between the second current, $I_B$, and the first current, $I_A$ comprises a phase lag in the second current, $I_B$, with respect to the first current, $I_A$.

19. The method of claim 16, wherein the capacitance is programmable over a range of frequencies and a range of gain states.

20. The method of claim 16, further comprising adjusting a value of the capacitance between zero and one picofarad (pF).

21. The method of claim 16, further comprising adjusting a value of the capacitance using a switchable capacitor.

22. An amplifier, comprising:

a first amplifier path comprising a first cascode device and a first amplifier, $M_A$, the first amplifier path configured to carry a first current, $I_A$;

a second amplifier path comprising a second cascode device and a second amplifier, $M_B$, the second amplifier path configured to carry a second current, $I_B$; and a capacitor coupled between a source of the second amplifier, $M_B$, and a node disposed between a source of the second cascode device and a drain of the second amplifier, $M_B$, the capacitor configured to create a phase displacement between the second current, $I_B$, and the first current, $I_A$.

23. The amplifier of claim 22, wherein the phase displacement between the second current, $I_B$, and the first current, $I_A$ reduces a third order intermodulation (IM3) component in an output of the amplifier.

24. The amplifier of claim 22, wherein the phase displacement between the second current, $I_B$, and the first current, $I_A$ comprises a phase lag in the second current, $I_B$, with respect to the first current, $I_A$.

25. The amplifier of claim 22, wherein the capacitor is programmable over a range of frequencies and a range of gain states.

26. The amplifier of claim 22, wherein a value of the capacitance is between zero and one picofarad (pF).

27. The amplifier of claim 22, wherein the amplifier is configured to receive an input signal at an input node and provide an output signal at an output node, the input node being coupled to a gate of the first amplifier, $M_A$, via a second capacitor and to a gate of the second amplifier, $M_B$, via a third capacitor, and the output node being coupled to a drain of the first cascode device and to a drain of the second cascode device.

28. The amplifier of claim 22, wherein the capacitor comprises a switchable capacitor.

29. The amplifier of claim 28, wherein the switchable capacitor comprises a capacitor bank having a plurality of switchable capacitors.

30. A circuit, comprising:
   a first amplifier path comprising a first amplifier, $M_A$;
   a second amplifier path comprising a cascode device and a second amplifier, $M_B$;
   a node defined by a source of the cascode device and a drain of the second amplifier, $M_B$; and
   a capacitance coupled between the node and a source of the second amplifier, $M_B$, the capacitance comprising a switchable capacitor.

\* \* \* \* \*